(12) United States Patent
Delvart

(10) Patent No.: US 6,661,311 B2
(45) Date of Patent: Dec. 9, 2003

(54) ELECTRIC APPARATUS COMPRISING A SHIELD AND TRANSMISSION MEANS WITH FILTERING OF AN ELECTRIC SIGNAL ON BOTH SIDES OF THE SHIELD

(75) Inventor: Bernard Delvart, Heudreville sur Eure (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 104 days.

(21) Appl. No.: 09/969,005

(22) Filed: Oct. 2, 2001

(65) Prior Publication Data

US 2002/0071264 A1 Jun. 13, 2002

(30) Foreign Application Priority Data

Oct. 3, 2000 (FR) .............................................. 00 12616

(51) Int. Cl.$^7$ .............................. H03H 7/01; H05K 9/00
(52) U.S. Cl. ......................... 333/181; 333/12; 361/818
(58) Field of Search ........................ 333/12, 181, 167; 361/816, 818

(56) References Cited

U.S. PATENT DOCUMENTS

| 4,942,509 | A | * | 7/1990 | Shires et al. ................... 363/89 |
| 5,165,055 | A | * | 11/1992 | Metsler ........................ 333/12 |
| 5,621,363 | A | * | 4/1997 | Ogden et al. .................. 333/12 |
| 5,841,202 | A | * | 11/1998 | Noguchi et al. ............... 333/12 |
| 6,016,089 | A | * | 1/2000 | Goudie ........................ 333/181 |
| 6,037,846 | A | * | 3/2000 | Oberhammer ............... 333/182 |
| 6,063,999 | A | * | 5/2000 | Kelly .......................... 361/818 |
| 6,121,546 | A | * | 9/2000 | Erickson et al. ............. 361/818 |
| 6,404,297 | B2 | * | 6/2002 | Cherniski et al. ............. 333/12 |

FOREIGN PATENT DOCUMENTS

EP          508336 A1 * 10/1992        ............ H01G/4/38

* cited by examiner

Primary Examiner—Seungsook Ham
(74) Attorney, Agent, or Firm—Michael E. Belk

(57) ABSTRACT

The invention relate to an electric apparatus which comprises a metallic housing formed by at least a part containing a switched-mode power supply, one part containing an amplifier and a shield separating these two parts. Openings are provided in the shield for transmitting signals from the first to the second part by filtering them. For this purpose, a filter device is provided. This device is formed by a print circuit which has at least an input/output, comprises a surface-mounted capacitor, a ground plane and a connection mechanism for connecting ground to the shield.

20 Claims, 2 Drawing Sheets

ELECTRIC APPARATUS COMPRISING A SHIELD AND TRANSMISSION MEANS WITH FILTERING OF AN ELECTRIC SIGNAL ON BOTH SIDES OF THE SHIELD

FIELD OF THE INVENTION

The invention relates to an electric apparatus comprising a housing formed by at least a first part containing a switched-mode power supply, a second part containing a processing circuit and a shield for isolating said first and second parts, said shield having at least an opening at which a filter device is installed.

The invention also relates to a cable distribution network comprising at least an electric apparatus of this type.

The invention notably applies to amplifiers used in the cable television signal distribution systems.

BACKGROUND OF THE INVENTION

The TONNA company, for example, is marketing such an apparatus referred to as 945331. In this apparatus the filter device comprises a circular capacitor passed through by a wire and mounted on a metallic support which is itself attached to the shield.

Such circular capacitors are marketed, for example, by the Californian company INSTEC under references P/N610-103A1 and P/N640-103B.

They have the drawback of being expensive and cumbersome when their attenuation capacity is large. For this reason, the capacitance of the circular capacitors used is generally limited to 10 nF.

Such an attenuation is not always sufficient. It is particularly not sufficient to filter voltages delivered on the output of the switched-mode power supply. A preliminary filter circuit is thus provided at the switched-mode power supply to limit the random noise in the supply voltages delivered at the output of the switched-mode power supply. The circular capacitor placed at the shield only has for its function to attenuate the random noise radiated at the power supply, which are the result of the wire connecting the switched-mode power supply to the processing circuit.

The invention notably has for its object to propose a filter device which has a large attenuation capacity, of which the cost and cumbersomeness is limited.

SUMMARY OF THE INVENTION

An electric apparatus according to the invention and as described in the opening paragraph is characterized in that said filter device is formed by a printed circuit which comprises:
- connection means for receiving a signal coming from said first part and for delivering a filtered signal to the second part,
- at least one ground plane,
- at least a capacitor of the surface-mounted type, arranged between said connection means and the ground plane,
- means for connecting ground to the shield.

The invention thus permits to obtain high-value capacitances at reduced cost and cumbersomeness. Since it is possible to utilize considerable attenuation capacitances, it is no longer necessary to provide a preliminary filtering at the switched-mode power supply.

By way of example, a circular capacitor as used in the prior art, which operates at a voltage of 50 V and which has a value of 10 nF costs about 2 euros. A circular capacitor of the same type having a value of 1 $\mu$F costs about 15 euros. In a printed circuit of 25 mm by 15 mm it is possible to realize various filters for filtering various signals by using surface-mounted capacitors which have a value of the order of 1 $\mu$F or more at a cost of about 1.5 euros.

One of the advantages of the invention is thus to permit the number of filtered signals to be multiplied without this significantly increasing the cost of the device.

Furthermore, the circular capacitors currently available on the market have a maximum value of 1 $\mu$F. The invention permits to obtain values which are much higher (of the order of 100 $\mu$F).

In a particularly efficient embodiment said printed circuit is a double-faced circuit with via holes in which the capacitor(s) is (are) mounted on one of the faces and the ground plane(s) is (are) mounted on the other face. The printed circuit is, for example, flush mounted on the shield by one or various leaf springs so that the ground(s) is (are) in contact with the shield.

These and other aspects of the invention are apparent from and will be elucidated with reference to the embodiments described hereinafter.

DESCRIPTION OF A PREFERRED EMBODIMENT OF THE INVENTION

Figure 1:
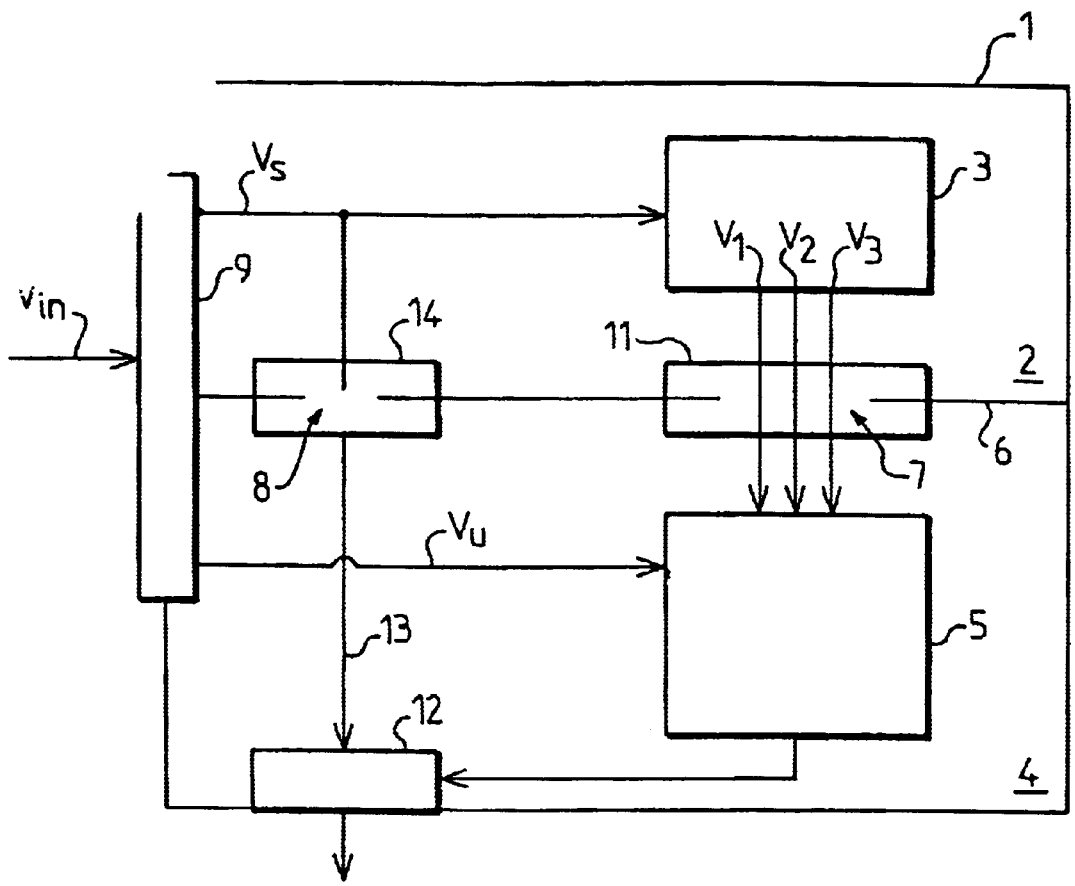
FIG. 1 is a diagram of an example of an electric apparatus according to the invention.

In FIG. 1 is shown an example of an electric apparatus according to the invention. This apparatus comprises a metallic housing 1 which contains in a first part 2 a switched-mode power supply 3 and in a second part 4, a processing circuit 5 which is an amplifier in this example of embodiment. The first and second parts 2 and 4 are isolated from each other by a shield 6. Two openings 7 and 8 are made in the shield 6.

The apparatus receives on its input a signal $V_{in}$ which is a combination of a television supply signal $V_S$ at 50 Hz and a useful signal $V_u$ contained in the 5 MHz–1 GHz band. These two signals are separated by filtering at the input 9 of the apparatus. The useful signal $V_u$ is transmitted to the amplifier 5. The television supply signal $V_s$ is transmitted to the switched-mode power supply 3.

In the example described here, the switched-mode power supply 3 delivers three DC voltages $V_1$ to $V_3$ of 24 V, 12 V and 5 V, respectively, based on the television supply signal which is an AC voltage of 48 V.

The switched-mode power supply 3 creates switching residues which have harmonics up to operating frequencies of the amplifier 5. A first filter device 11 is fixed to the shield 6 at the first opening 7 to filter the residues which are contained in these three voltages $V_1$ to $V_3$.

The remote supply signal $V_s$ of the apparatus is redirected to an output 12 of the apparatus via a cable 13 which passes through the parts 2 and 4 of the housing 1 while passing through the second opening 8. A second filter device 14 is fixed at this second opening 8 to filter the random noise radiated by the switched-mode power supply 3 connected by the cable 13.

The useful signal $V_u$ is amplified by the amplifier 5. And the amplifier signal is combined, via filtering, with the remote supply signal $V_s$ at the output 12.

Figure 2:
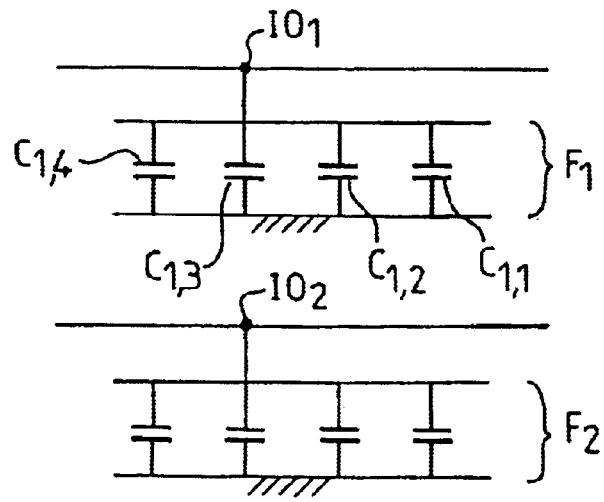
FIG. 2 is an electrical diagram of an example of a filter device according to the invention.

FIG. 2 shows an electrical diagram of the filter device 11. According to FIG. 2 the filter device 11 comprises:

three inputs/outputs $IO_1$ to $IO_3$ which receive each a supply voltage supplied by the switched-mode power supply 3 and which each deliver a filtered voltage to the amplifier 5, three filters $F_1$ to $F_3$ mounted between these three inputs/outputs $IO_1$ to $IO_3$ and ground for filtering the three supply voltages produced by the switched-mode power supply 3.

In this example of embodiment each filter $F_i$ is formed by three capacitors $C_{i,1}$ to $C_{i,4}$ connected in parallel between ground, on the one hand, and an input/output $IO_i$ of the device, on the other. These four capacitors have a value of 1 $\mu F$ each, for example. For example, capacitors 222293416651 manufactured by Philips are used.

Figure 3:
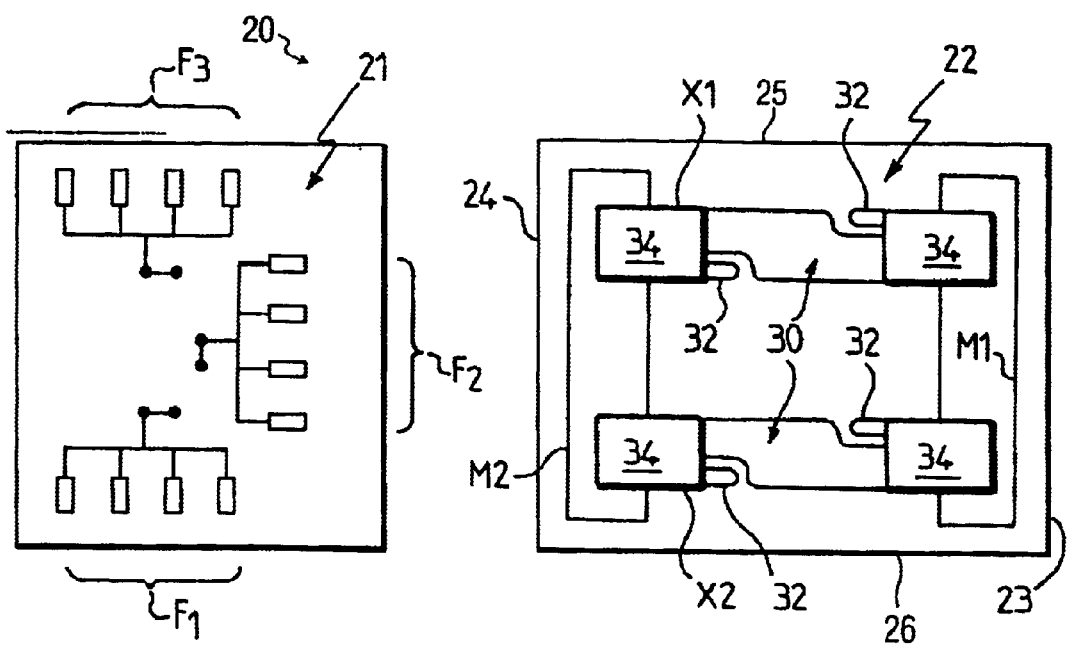
FIG. 3 is a mechanical diagram of an example of a filter device according to the invention and FIG. 4 is an example of a cable distribution network according to the invention.

FIG. 3 shows a mechanical diagram of a filter device 11 according to the invention. According to FIG. 3 the filter device 11 comprises a printed circuit 20 which is a double-faced circuit with via holes.

In this example of embodiment the circuit 20 has a rectangular form. Surface-mounted capacitors are mounted on a first face 21 of the printed circuit 20 so as to form the three filters $F_1$ to $F_3$. Two ground planes $M_1$ and $M_2$ are placed on a second face 22 of the circuit 20 along two parallel sides 23 and 24 of the circuit 20. Two metallic leaf springs X1 and X2 are also mounted on this second face along two other sides 25 and 26 of the circuit 20. These leaf springs comprise a flat central part 30 which has two feet 32 which are inserted into the printed circuit, and two side parts 34 in the form of clips which press the walls of the shield 6 at the opening 7 to the ground planes $M_1$ and $M_2$.

The filter device 14, which is fixed at the opening 8, is similar to the filter device 11 which has just been described. But it comprises only a single filter. This filter is formed, for example, by five capacitors arranged in parallel having each a value of 120 nF. Capacitors 222291119863 manufactured by Philips may be used, for example.

Figure 4:
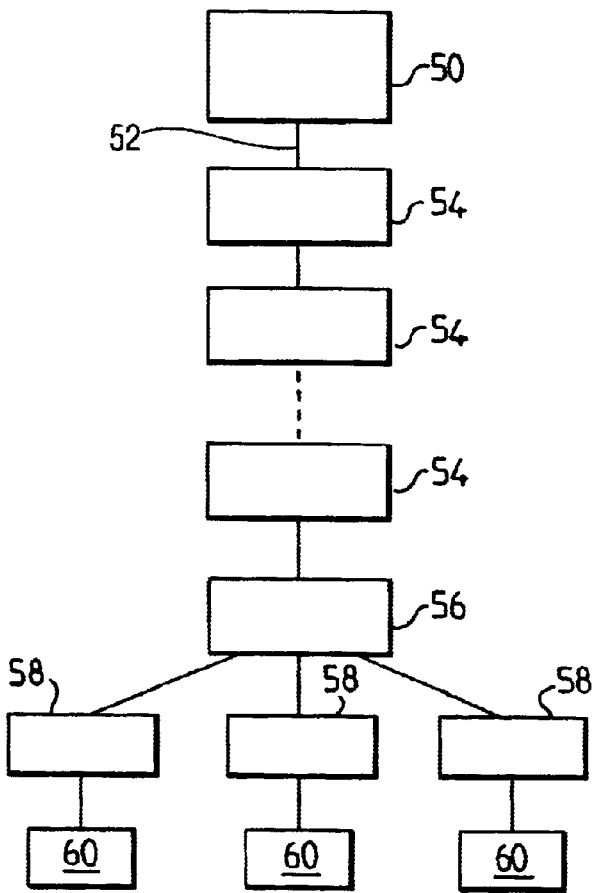

In FIG. 4 is shown an example of a cable distribution network according to the invention. This network comprises a network head end 50, a transmission cable 52, amplifiers 54 as described above, placed at regular distances on the cable and whose function is to compensate for the attenuation of the useful signal due to the transport over the cable, distributors 56 and, at each destination point, an input box 58 connected to a television receiver 60.

The invention is not restricted to the embodiment that has just been described by way of example. More particularly, the use of a double-faced circuit having via holes is particularly interesting because it permits to reduce the cumbersomeness of the circuit and permits to simplify its manufacture. However, it is possible to utilize a single-face circuit by placing the surface-mounted capacitors on the same side as ground.

Similarly, the leaf springs are not the only fixation means which may be used for fixing the printed circuit 20 to the shield 3. For example, screws, rivets . . . may be used.

The use of metallic fastening means has the following advantages:

good temperature behavior, ease of mounting (mounting by soldering on the printed circuit), improvement of the electrical contact.

It is possible, however, to utilize fixing means which are not metallic, for example, fixing means of plastic material.

What is claimed is:

1. An electric apparatus comprising a housing formed by at least a first part containing a switched-mode power supply, a second part containing a processing circuit and a shield for isolating said first and second parts, said shield having at least an opening at which a filter device is installed, said filter device is formed on a printed circuit which includes:

connection means for receiving a plurality of signals coming from said first part and for delivering a filtered version of said signals to said second part, wherein said connection means provides separate connectors for each of said plurality of signals, at least one ground plane, at least a capacitor of the surface-mounted type provided for each of said signals arranged between said connection means and said ground plane, means for connecting said ground plane to said shield.

2. An apparatus as claimed in claim 1, characterized in that said printed circuit is a double-faced circuit having via holes, said capacitor being arranged on one of the faces and said ground plane being formed on the opposite face.

3. An apparatus as claimed in claim 1, characterized in that said filter device is fixed to said shield by at least a leaf spring.

4. A cable distribution network comprising at least one electric apparatus as claimed in claim 1.

5. The apparatus of claim 1 further comprising said switch-mode power supply receiving a television supply signal and outputting a plurality of voltages.

6. The apparatus of claim 1 wherein said plurality of signals further comprise at least one voltage from said power supply and at least one useful signal not from said power supply.

7. The apparatus of claim 6 further comprising combination means for providing a combined signal from the filtered versions of said voltage from said power supply and said useful signal not from said power supply, wherein said combined signal is provided to said second part.

8. The apparatus of claim 7 wherein said filter further comprises a first filter for said at least one voltage and a second filter for said useful signal.

9. The apparatus of claim 8 further comprising an input and an input filter, said input receiving an input signal containing a combined version of said useful signal and a television supply signal, wherein said input filter separates said input signal into said useful signal and a power supply voltage.

10. An electric apparatus having a housing formed by at least a first part containing a power supply that provides a plurality of voltages, a second part containing a processing circuit and a shield that isolates said first part from said second part, said shield having at least one opening with a filter device installed, wherein said filter device comprises:

a circuit board located at said opening, said circuit board having a plurality of connectors with at least one of said connectors connected to each of said voltages;

a plurality of filter channels formed on said circuit board such that there is at least one filter channel for each of said connectors, each of said filter channels having at least one capacitor operatively connected to one of said voltages and a ground plane; and an output to each of said connection mechanisms, wherein each of said outputs provides one of said voltages to said second part;

whereby, said second part is provided with a filtered version of each of said voltages.

11. The apparatus of claim 10 wherein each of said filter channels further comprises a plurality of capacitors connected in a parallel circuit to one of said voltages and said ground plane.

12. The apparatus of claim 11 wherein said capacitors are surface mount capacitors placed on a first side of said circuit board.

13. The apparatus of claim 12 wherein said ground plane is operatively connected to said shield.

14. The apparatus of claim 12 wherein said ground plane is formed on a first side of said circuit board and said capacitors are located on a second side of said circuit board.

15. The apparatus of claim 12 placed within a cable distribution network.

16. The apparatus of claim 12 further comprising said ground plane being formed on a second side of said circuit board and connected to said capacitors through vias within said circuit board.

17. The apparatus of claim 16 wherein said ground plane is actually a pair of ground planes formed opposite ends of said second side of said circuit board.

18. The apparatus of claim 17 further comprising a mechanical fastening device formed on the second side of said circuit board, said mechanical fastening device being formed from a conductive material and contacting each said pair of ground planes.

19. The apparatus of claim 10 further comprising a second filter located at a second opening in said shield, said second filter having connection means, and an auxiliary filter including a plurality of capacitors arranged on a first side of a second circuit board and a ground plane formed on a second side of said second circuit board, wherein said auxiliary filter provides filtering for a signal independent of said voltages.

20. The apparatus of claim 19 further comprising combination means for combining the filtered version of said signal and at least one of said filtered voltages.

* * * * *